US007911295B2

(12) United States Patent
Inuzuka et al.

(10) Patent No.: US 7,911,295 B2

(45) Date of Patent: Mar. 22, 2011

(54) COMMON MODE NOISE FILTER

(75) Inventors: Tsutomu Inuzuka, Osaka (JP); Hiroshi Fujii, Osaka (JP); Hironori Motomitsu, Osaka (JP); Shogo Nakayama, Osaka (JP)

(73) Assignee: Panasonic Corporation, Osaka (JP)

(*) Notice: Subject to any disclaimer, the term of this patent is extended or adjusted under 35 U.S.C. 154(b) by 467 days.

(21) Appl. No.: 11/571,435

(22) PCT Filed: May 8, 2006

(86) PCT No.: PCT/JP2006/009247

§ 371 (c)(1),
(2), (4) Date: Dec. 29, 2006

(87) PCT Pub. No.: WO2006/121003

PCT Pub. Date: Nov. 16, 2006

(65) Prior Publication Data

US 2009/0003191 A1 Jan. 1, 2009

(30) Foreign Application Priority Data

May 11, 2005 (JP) ................................. 2005-138030

(51) Int. Cl.
*H03H 7/01* (2006.01)
*H01F 27/28* (2006.01)

(52) U.S. Cl. ......... 333/185; 336/200; 336/223; 336/232

(58) Field of Classification Search .................. 333/177, 333/181, 184, 185; 336/182, 200, 223, 232
See application file for complete search history.

(56) References Cited

U.S. PATENT DOCUMENTS

| | | | | |
|---|---|---|---|---|
| 5,599,413 | A * | 2/1997 | Nakao et al. | 156/89.12 |
| 6,541,968 | B1 * | 4/2003 | Tokuda | 324/258 |
| 6,566,731 | B2 * | 5/2003 | Ahn et al. | 257/531 |
| 6,710,694 | B2 * | 3/2004 | Matsuta et al. | 336/200 |
| 6,853,267 | B2 * | 2/2005 | Chiba et al. | 333/185 |
| 7,362,205 | B2 * | 4/2008 | Ito et al. | 336/200 |
| 2004/0130415 | A1 | 7/2004 | Chiba et al. | |
| 2004/0135652 | A1 | 7/2004 | Uchida et al. | |

FOREIGN PATENT DOCUMENTS

| | | | |
|---|---|---|---|
| JP | 6-61051 | A | 3/1994 |
| JP | 6-61057 | A | 3/1994 |
| JP | 2002-84157 | A | 3/2002 |

(Continued)

OTHER PUBLICATIONS

Japanese language International Search Report for PCT/JP2006/309247, dated Aug. 8, 2006.

(Continued)

*Primary Examiner* — Robert Pascal
*Assistant Examiner* — Kimberly E Glenn
(74) *Attorney, Agent, or Firm* — RatnerPrestia

(57) ABSTRACT

A common mode noise filter includes a nonmagnetic layer, first and second magnetic layers sandwiching the nonmagnetic layer between the magnetic layers and contacting the nonmagnetic layer, a plane coil provided between the first and second magnetic layers and contacting the nonmagnetic layer, and an external electrode connected electrically with the plane coil. The first and second magnetic layers include a magnetic oxide layer and an insulator layer provided on the magnetic oxide layer. The insulator layer contains glass component. This common mode noise filter has a large bonding strength between the external electrode and the insulator layer.

20 Claims, 10 Drawing Sheets

FOREIGN PATENT DOCUMENTS

| | | | |
|---|---|---|---|
| JP | 2002-203718 A | | 7/2002 |
| JP | 2002-208535 A | | 7/2002 |
| JP | 2003-31416 A | | 1/2003 |
| JP | 2003-297646 A | | 10/2003 |
| JP | 2004-266784 A | | 9/2004 |
| JP | 2004-339016 A | | 12/2004 |
| JP | 2004-339031 A | | 12/2004 |
| JP | 2008159738 A | * | 7/2008 |

OTHER PUBLICATIONS

Japanese Office Action for Application No. 2005-138030, Jul. 27, 2010, Panasonic Corporation.

* cited by examiner

Fig. 11

| | Bonding Strength (g) | | |
|---|---|---|---|
| | Average | Maximum | Minimum |
| Embodiment 1 | 414 | 554 | 320 |
| Embodiment 2 | 423 | 565 | 366 |
| Embodiment 3 | 445 | 582 | 422 |
| Embodiment 4 | 433 | 568 | 398 |
| Embodiment 5 | 440 | 575 | 399 |
| Comparative Example | 345 | 512 | 208 |

Fig. 12 PRIOR ART
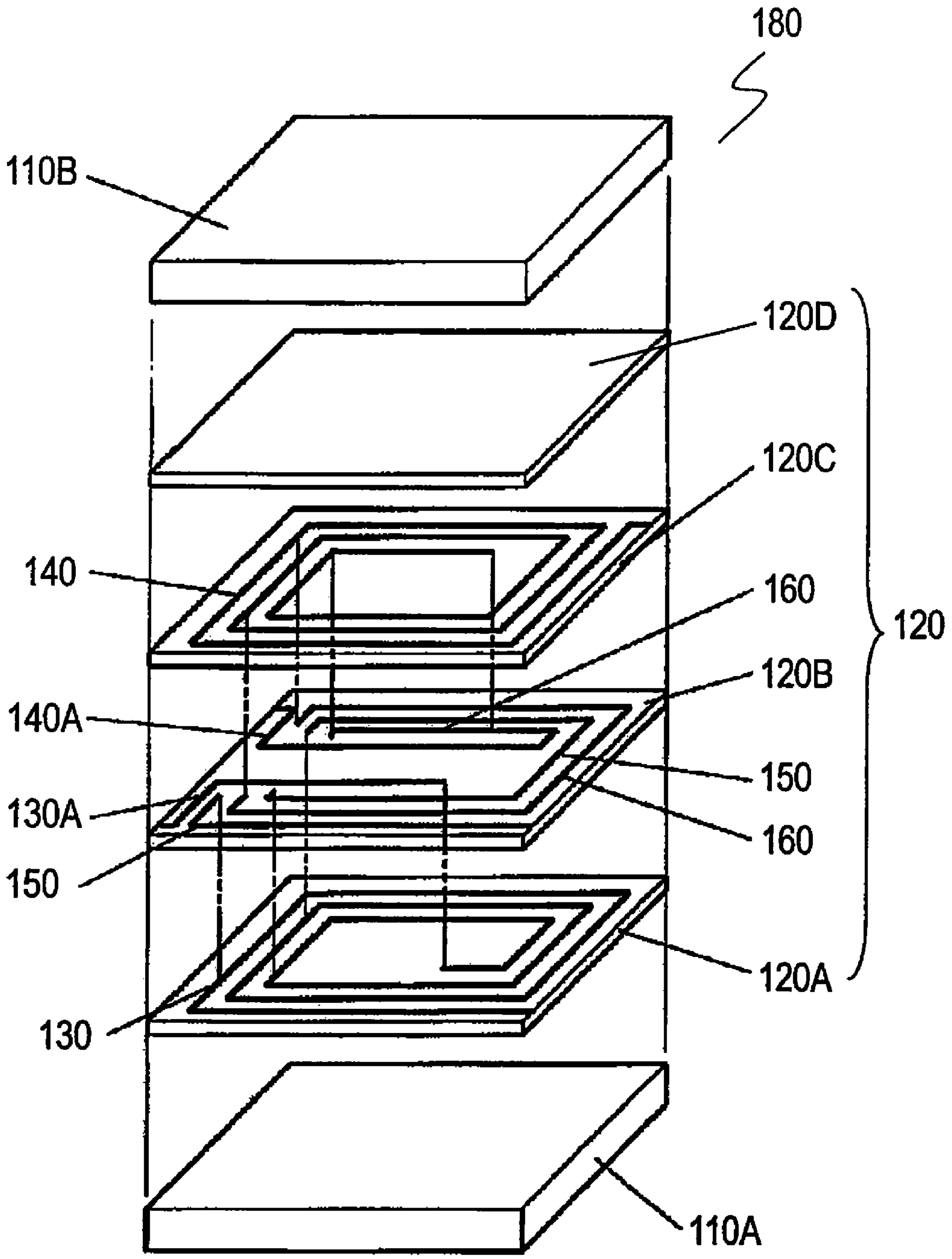

COMMON MODE NOISE FILTER

TECHNICAL FIELD

The present invention relates to a common mode noise filter for suppressing common mode noises in an electronic device.

BACKGROUND ART

Common mode noise filters have large impedance for common mode signals to remove common mode noises. The common mode noise filters have small impedance for differential mode signals, necessary signals, to prevent the signal from being distorted.

FIG. 12 is an exploded perspective view of conventional common mode noise filter 180 disclosed in Japanese Patent Laid-Open Publication No. 2002-203718. Filter 180 includes insulating magnetic substrates 110A and 110B and insulator layers 120A to 120D made of nonmagnetic material. Insulator layers 120A to 120D have spiral coil patterns 130, 140, 150, and 160 formed thereon. Insulator layers 120A to 120D are stacked to form insulating block 120 made of the nonmagnetic material. Coil patterns 130, 140, 150, and 160 are embedded in insulating block 120, and are sandwiched between magnetic substrates 110A and 110B, thus providing common mode noise filter 180. Coil patterns 130, 140, 150, and 160 provide two coils having terminals electrically connected with external edge electrodes, respectively.

Conventional common mode noise filter 180 has a small bonding strength to dielectric block 120 of the external edge electrodes due to decreasing of the area of the external edge electrodes according to reducing of its size. Filter 180 may have low reliability to be mounted on a portable electronic device.

SUMMARY OF THE INVENTION

A common mode noise filter includes a nonmagnetic layer, first and second magnetic layers sandwiching the nonmagnetic layer between the magnetic layers and contacting the nonmagnetic layer, a plane coil provided between the first and second magnetic layers and contacting the nonmagnetic layer, and an external electrode connected electrically with the plane coil. The first and second magnetic layers include a magnetic oxide layer and an insulator layer provided on the magnetic oxide layer. The insulator layer contains glass component.

This common mode noise filter has a large bonding strength between the external electrode and the insulator layer.

BRIEF DESCRIPTION OF DRAWINGS

FIG. 11 shows evaluation results of the common mode noise filters according to Embodiments 1 to 5.

FIG. 12 is an exploded perspective view of a conventional common mode noise filter.

REFERENCE NUMERALS

20 Nonmagnetic Layer
21A Magnetic Layer (First Magnetic Layer)
21B Magnetic Layer (Second Magnetic Layer)
22A Plane Coil (First Plane Coil)
22B Plane Coil (Second Plane Coil)
22E, 22F Plane Coil
25A, 25B External Electrode (First External Electrode)
25C, 25D External Electrode (Second External Electrode)
523A Magnetic Oxide Layer (First Magnetic Oxide Layer)
523B Magnetic Oxide Layer (Second Magnetic Oxide Layer)
623A, 623B Magnetic Oxide Layer
723A Magnetic Oxide Layer (Third Magnetic Oxide Layer)
723B Magnetic Oxide Layer (Fourth Magnetic Oxide Layer)
520A Surface of Nonmagnetic Layer (First Surface)
520B Surface of Nonmagnetic Layer (Second Surface)
524A Insulator Layer (First Insulator Layer)
524B Insulator Layer (Second Insulator Layer)
624A, 624B Insulator Layer
724A Insulator Layer (Third Insulator Layer)
724B Insulator Layer (Fourth Insulator Layer)

DETAILED DESCRIPTION OF PREFERRED EMBODIMENTS

Exemplary Embodiment 1

Figure 1:
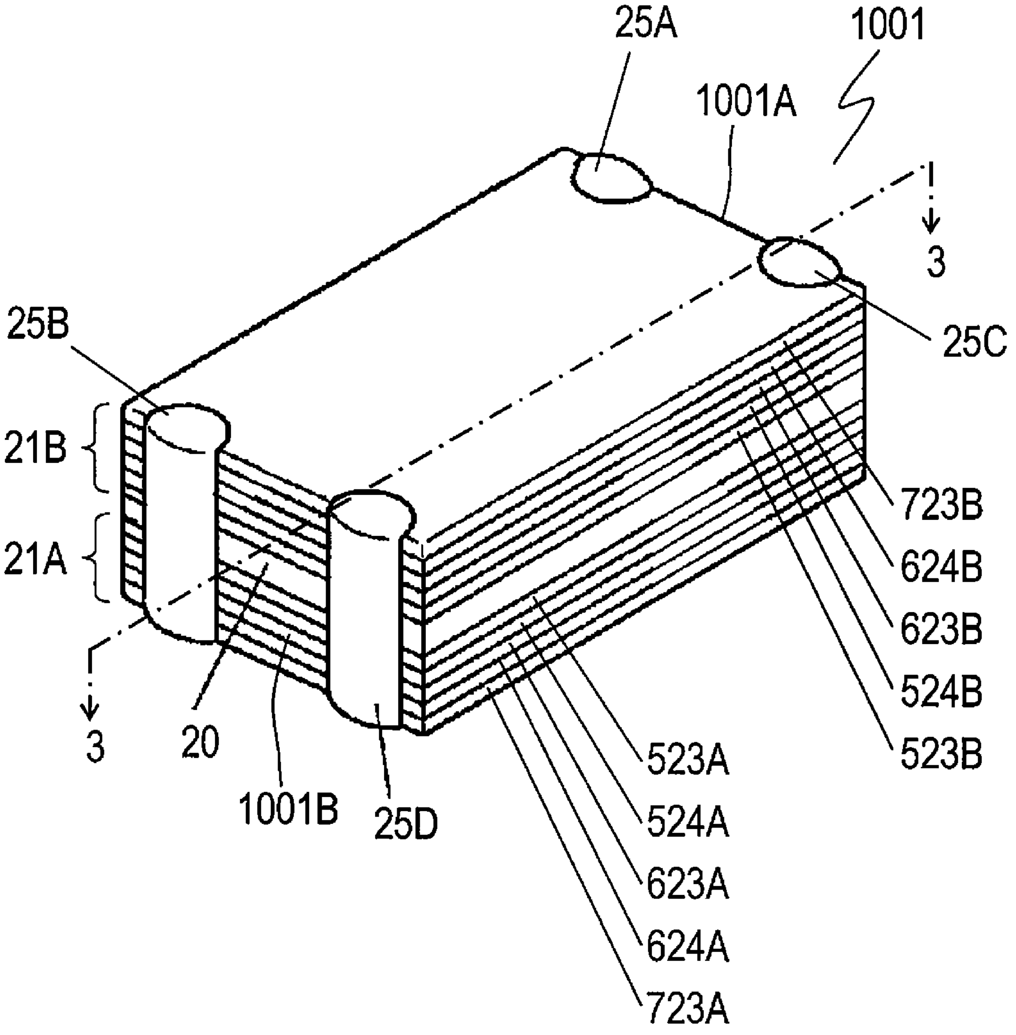
FIG. 1 is a perspective view of a common mode noise filter according to Exemplary Embodiments 1 and 2 of the present invention.
Figure 2:
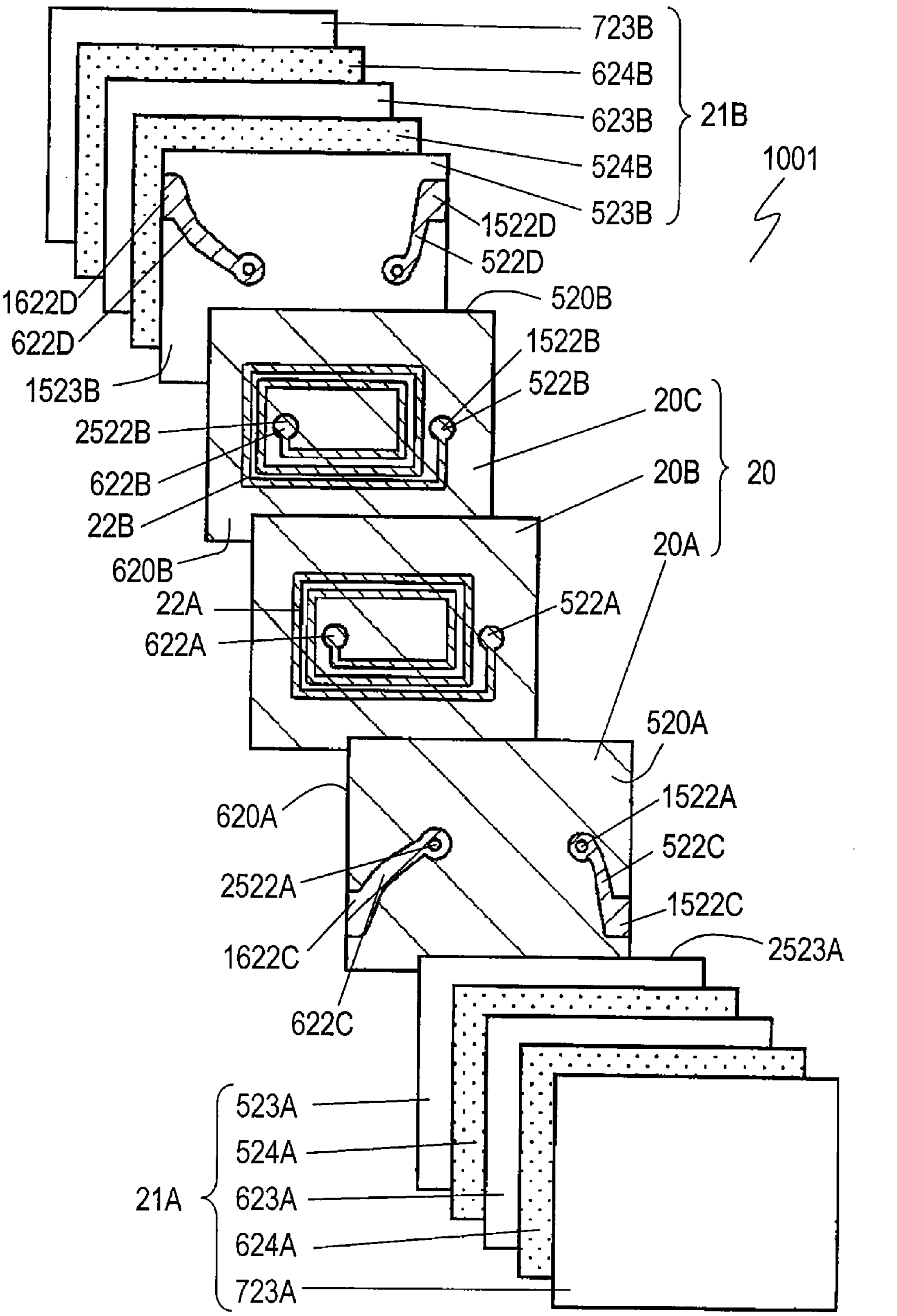
FIG. 2 is an exploded view of the common mode noise filter according to Embodiments 1 and 2.
Figure 3:
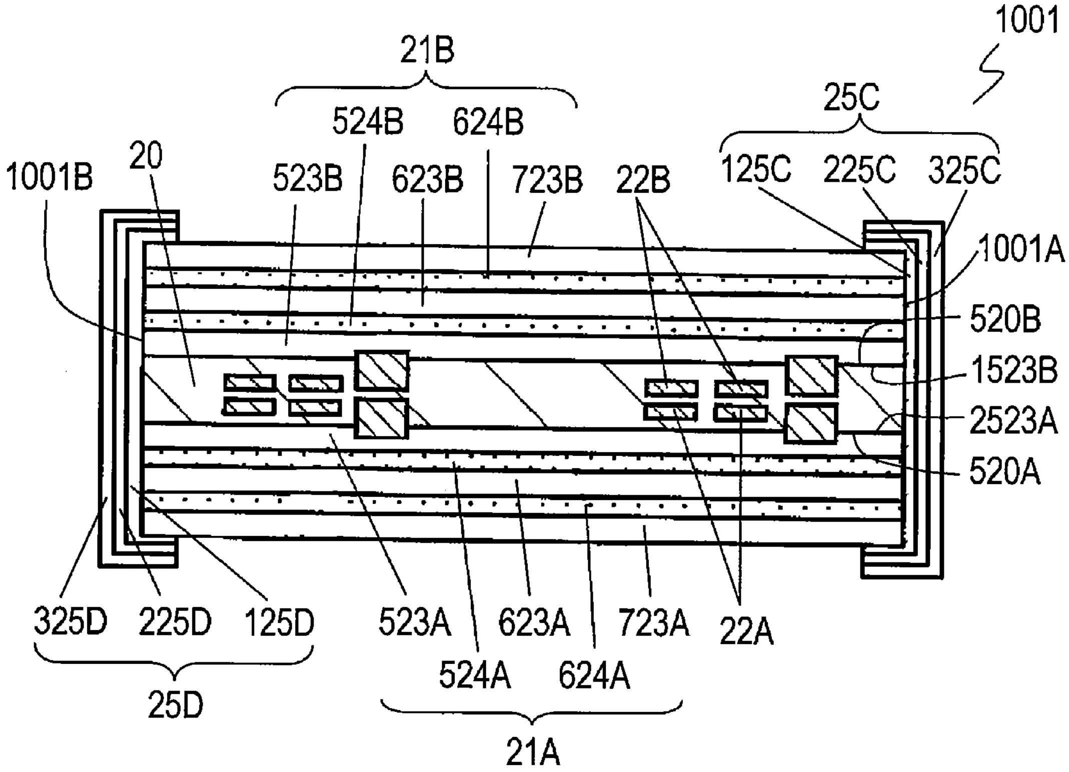
FIG. 3 is a sectional view of the common mode noise filter at line 3-3 shown in FIG. 1.

FIG. 1 is a perspective view of common mode noise filter 1001 according to Exemplary Embodiment 1 of the present invention. FIG. 2 is an exploded view of filter 1001. FIG. 3 is a sectional view of filter 1001 at line 3-3 shown in FIG. 1.

Common mode noise filter 1001 includes nonmagnetic layer 20, magnetic layers 21A and 21B, plane coils 22A and 22B, and external electrodes 25A to 25D. Nonmagnetic layer 20 is made of nonmagnetic insulating material, such as glass ceramic, and has surface 520A and surface 520B opposite to surface 520A. Magnetic layer 21A is provided on surface 520A of nonmagnetic layer 20. Magnetic layer 21B is provided on surface 520B. Plane coils 22A and 22B are provided between magnetic layers 21A and 21B and contact nonmagnetic layer 20. Coils 22A and 22B face each other. In filter 1001, plane coils 22A and 22B are embedded in nonmagnetic layer 20. Plane coil 22A has ends 522A and 622A. Ends 522A and 622A are connected to external electrodes 25A and 25B via extraction electrodes 522C and 622C, respectively. Plane coil 22B has ends 522B and 622B. Ends 522B and 622B are connected to external electrodes 25C and 25D via extraction electrodes 522D and 622D, respectively. Magnetic layer 21A includes magnetic oxide layer 523A provided on surface 520A of nonmagnetic layer 20, insulator layer 524A on magnetic oxide layer 523A, magnetic oxide layer 623A on insulator layer 524A, insulator layer 624A on magnetic oxide layer 623A, and magnetic oxide layer 723A on insulator layer 624A. Magnetic layer 21B includes magnetic oxide layer 523B provided on surface 520B of nonmagnetic layer 20, insulator layer 524B on magnetic oxide layer 523B, magnetic oxide layer 623B on insulator layer 524B, insulator layer 624B on magnetic oxide layer 623B, and magnetic oxide layer 723B on insulator layer 624B. Insulator layers 524A, 624A, 524B, and 624B contain glass component. Filter 1001 includes four insulator layers and six magnetic oxide layers, and the numbers of these layers may be changed according to the shape of filter 1001.

Nonmagnetic layer 20 includes nonmagnetic segment layer 20A having surface 520A, nonmagnetic segment layer 20B provided on nonmagnetic segment layer 20A, and nonmagnetic segment layer 20C which is provided on nonmagnetic segment layer 20B and has surface 520B.

A method of manufacturing common mode noise filter 1001 will be described below. First, Zn—Cu ferrite powder, material of nonmagnetic segment layers 20A to 20C of nonmagnetic layer 20 is mixed with solvent and binder component, thereby to producing ceramic slurry. Then, the ceramic slurry is molded by, for example, a doctor blade method, to produce ceramic green sheets having predetermined thicknesses of about 25 μm providing nonmagnetic segment layers 20A to 20C.

Similarly, powder non-borosilicate glass ($SiO_2$—CaO—ZnO—MgO based glass) which can be fired at a temperature not higher than 920° C. is mixed with 9 wt % of Ni—Zn—Cu ferrite to produce ceramic green sheets with thicknesses of about 25 μm providing insulator layers 524A, 524B, 624A, and 624B.

Ceramic green sheets with thicknesses of about 100 μm for providing magnetic oxide layers 523A, 523B, 623A, 623B, 723A, and 723B are produced from magnetic powder of Ni—Zn—Cu ferrite oxide magnetic substance.

Then, as shown in FIG. 2, conductors having predetermined coil patterns and via-electrodes for electrical connection between layers are provided on these ceramic green sheets. These ceramic green sheets are stacked, and fired at a predetermined temperature, thus producing a laminated fired body.

A method of forming plane coils 22A and 22B and nonmagnetic layer 20 will be described below.

Magnetic oxide layer 523A has surface 2523A contacting surface 520A of nonmagnetic layer 20. Magnetic oxide layer 523B has surface 1523B contacting surface 520B of nonmagnetic layer 20. Extraction electrodes 522C and 622C are formed on surface 2523A of magnetic oxide layer 523A. Then, magnetic oxide layers 523A, 623A, and 723A and insulator layers 524A, and 624A are stacked to produce magnetic layer 21A.

Plane coil 22A is formed on surface 620A of nonmagnetic segment layer 20A opposite to surface 520A. Via-conductor 1522A communicating with surface 520A and surface 620A are formed in nonmagnetic segment layer 20A at a position contacting end 522A of plane coil 22A and extraction electrode 522C. Via-conductor 2522A communicating with surface 520A and surface 620A is formed in nonmagnetic segment layer 20A at a position contacting end 622A of plane coil 22A and extraction electrode 622C. Via-conductor 1522A connects end 522A of plane coil 22A electrically with extraction electrode 522C. Via-conductor 2522A connects end 622A of plane coil 22A electrically with extraction electrode 622C.

Plane coil 22B is formed on surface 620B of nonmagnetic segment layer 20C opposite to surface 520B. Via-conductor 1522B communicating with surface 520B and surface 620B is formed in nonmagnetic segment layer 20C at a position contacting end 522B of plane coil 22B and extraction electrode 522D. Via-conductor 2522B communicating surface 520B and surface 620B is formed in nonmagnetic segment layer 20C at a position contacting end 622B of plane coil 22B and extraction electrode 622D. Via-conductor 1522B electrically connects end 522B of plane coil 22B electrically with extraction electrode 522D. Via-conductor 2522B connects end 622B of plane coil 22B electrically with extraction electrode 622D.

Then, nonmagnetic segment layer 20A is stacked on magnetic layer 21A so that surface 520A of nonmagnetic segment layer 20A contacts surface 2523A of magnetic layer 21A. Then, nonmagnetic segment layers 20B and 20C are stacked to produce nonmagnetic layer 20 that has plane coils 22A and 22B and via-conductors 1522A, 1522B, 2522A, and 2522B all embedded in nonmagnetic layer 20.

Next, magnetic oxide layer 523B is stacked on surface 520B of nonmagnetic layer 20 so that surface 520B of nonmagnetic layer 20 contacts surface 1523B of magnetic oxide layer 523B. Then, insulator layer 624B, magnetic oxide layer 623B, insulator layer 624B, and magnetic oxide layer 723B are stacked in this order on magnetic oxide layer 523B to produce a green-sheet-laminated body including magnetic layers 21A and 21B and nonmagnetic layer 20. This green-sheet-laminated body is fired at a temperature lower than the melting point of the material of plane coils 22A and 22B, thus providing laminated fired body having plane coils 22A and 22B embedded therein.

The laminated fired body has edge surfaces 1001A and 1001B. Ends 1522C and 1522D of extraction electrodes 522C and 522D expose at edge surface 1001A. Ends 1622C and 1622D of extraction electrodes 622C and 622D expose at edge surface 1001B. External electrode 25C electrically connected with end 1522D of extraction electrode 522D is formed on edge surface 1001A by the following method. Ag paste containing glass frit as glass component is applied onto edge surface 1001A as to contact end 1522D of extraction electrode 522D, thus providing base electrode layer 125C, an Ag-metallized layer connected with end 1522D. Then, Ni-plated layer 225C is formed on base electrode layer 125C by Ni plating, and Sn-plated layer 325C is formed on Ni-plated layer 225C, thus producing external electrode 25C. Similarly, external electrode 25D connected electrically with end 1622D of extraction electrode 622D is formed on edge surface 1001B by the following method. Ag paste is applied onto edge surface 1001B as to contact end 1622D of extraction electrode 622D thus providing base electrode layer 125D, an Ag metallized layer connected with end 1622D. Base electrode layer 125D of external electrode 25D contacts insulator layers 524A, 524B, 624A, and 624B, nonmagnetic layer 20, and oxidization magnetic layers 523A, 523B, 623A, 623B, 723A, and 723B. Then, Ni-plated layer 225D is formed on base electrode layer 125D by Ni plating, and Sn-plated layer 325D is formed on Ni-plated layer 225D thus producing external electrode 25D. Similarly, external electrode 25A connected with end 1522C of extraction electrode 522C is formed on edge surface 1001A to form external electrode 25B which is connected with end 1622C of extraction electrode 622C and located on edge surface 1001B. External electrodes 25A to 25D may be produced by other methods for forming terminals of ceramic electronic components.

In common mode noise filter 1001, external electrodes 25A to 25D include the base electrode layers made of Ag paste containing glass frit tightly jointed with insulator layers 524A, 524B, 624A, and 624B including the glass component, and thus have strong bonding strength to edge surfaces 1001A and 1001B. Magnetic oxide layers 523A, 523B, 623A, 623B, 723A, and 723B having excellent magnetic properties couples plane coils 22A and 22B tightly with each other magnetically.

Fifty pieces of samples of common mode noise filter 1001 of Embodiment 1 were produced, and were measured in the bonding strength of edge surfaces 1001A, 1001B of external electrodes 25A to 25D. The samples according to Embodiment 1 have thicknesses of 0.5 mm, widths of 1.0 mm, and lengths of 1.2 mm. Conductive wires having diameters of 0.20 mm were soldered to external electrodes 25A and 25B which are positioned opposite to each other; and were pulled by a tensile testing machine until the electrodes broke. FIG. 11 shows average, maximum, and minimum values of tensile forces when the wires broke. FIG. 11 further shows the bonding strength of edge electrode 25 of samples of comparative examples including magnetic layers made of only oxide magnetic material, instead of magnetic layers 21A and 21B.

As shown in FIG. 11, external electrodes 25A to 25D according to example 1 have stronger bonding strength and smaller variation than the comparative examples. Thus, magnetic layers 21A and 21B include magnetic oxide layers and insulator layers including glass which are stacked, and provides reliable common mode noise filter 1001 without depressing its electrical characteristics.

Magnetic oxide layers 523A, 523B, 623A, 623B, 723A, and 723B contain Ni—Zn—Cu ferrite. These layers may be made of other magnetic oxide material which can be fired together with Ag, the material of plane coils 22A and 22B, at a temperature not higher than 920° C., and which has a magnetic permeability not smaller than 20 for providing electrical characteristics as a common mode noise filter.

The thicknesses of magnetic oxide layers 523A, 523B, 623A, 623B, 723A, and 723B range preferably from about 50 μm to 150 μm, while the thicknesses depend on the size of the common mode noise filter. Thicknesses smaller than 50 μm do not provide adequate electrical characteristics as a common mode noise filter. Thicknesses larger than 150 μm decrease the number of insulator layers containing glass component, thereby hardly providing external electrodes 25A to 25D with large bonding strength.

Insulator layers 524A, 524B, 624A, and 624B containing the glass component is made of mixture of borosilicate glass powder and Ni—Zn—Cu ferrite powder. The mixture ratio of the borosilicate glass powder to the Ni—Zn—Cu ferrite powder may be changed to control the characteristic of the common mode noise filter, while the mixture ratio of the Ni—Zn—Cu ferrite ranges preferably from 0 wt % to 15 wt %. A mixture ratio not less than 15 wt % causes the green-sheet-laminated body to be sintered sufficiently at 920° C. and decreases the mechanical strength of common mode noise filter 1001, resulting in defects, such as chipping during a mounting process. Instead of borosilicate glass powder, other glass powder, such as borosilicate alkali glass, that can be fired at a temperature not higher than 920° C. and additionally has a linear expansion coefficient ranging from $80\times10^{-7}$/° C. to $110\times10^{-7}$/° C. Glass powder having a linear expansion coefficient out of this range may cause defects, such as a crack, due to the difference between linear expansion coefficients of the glass powder and the oxide magnetic material.

Instead of Zn—Cu ferrite, other nonmagnetic insulating material that is substantially nonmagnetic and can be fired at 920° C., and that has a linear expansion coefficient ranging from $80\times10^{-7}$/° C. to $110\times10^{-7}$/° C. can be used for nonmagnetic layer 20.

The magnetic oxide layer including magnetic layers 21A and 21B made of Ni—Zn—Cu ferrite can be fired simultaneously together with material, such as silver, having a large conductivity. The insulator layer may be made of glass ceramic, or mixture of oxide magnetic material and the glass ceramic, that can be fired simultaneously together with the magnetic oxide layer.

Figure 4:
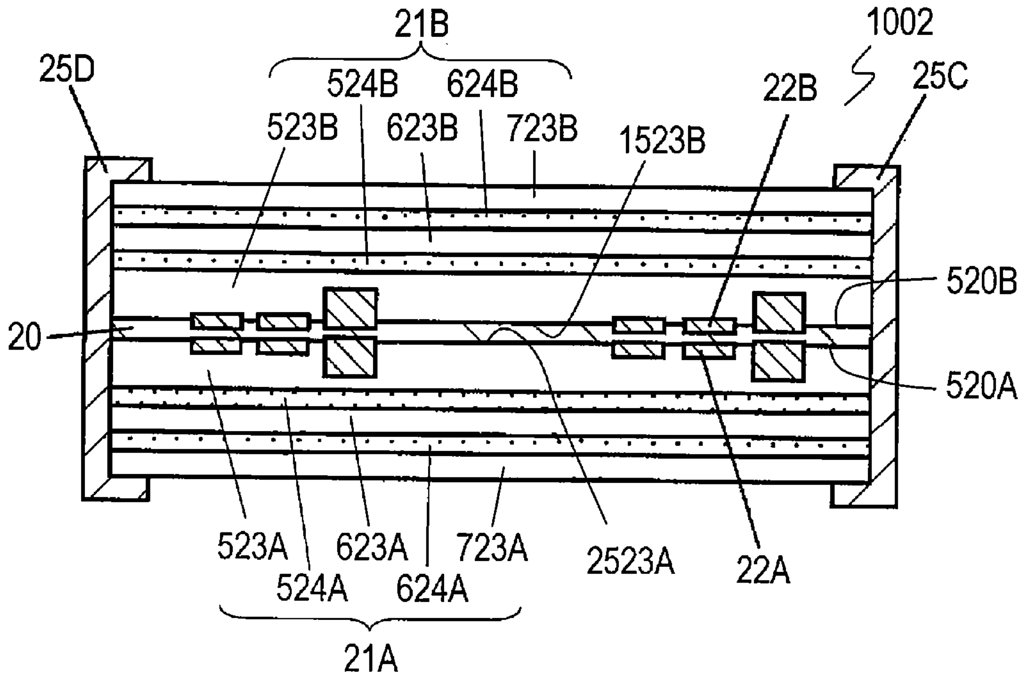
FIG. 4 is a sectional view of another common mode noise filter according to Embodiment 1.

FIG. 4 is a sectional view of another common mode noise filter 1002 according to Embodiment 1. In FIG. 4, components identical to those shown in FIGS. 1 to 3 are denoted by the same reference numerals, and their description is omitted. In filter 1002, plane coil 22A is provided at the boundary between nonmagnetic layer 20 and magnetic layer 21A, namely, between surface 520A of nonmagnetic layer 20 and surface 2523A of magnetic layer 21A (magnetic oxide layer 523A). Plane coil 22B is provided at the boundary between nonmagnetic layer 20 and magnetic layer 21B, namely, between surface 520B of nonmagnetic layer 20 and surface 1523B of magnetic layer 21B (magnetic oxide layer 523B). Plane coils 22A and 22B approximate more closely to magnetic layers 21A and 21B, respectively, than those of common mode noise filter 1001 shown in FIG. 3, accordingly allowing filter 1002 to have higher impedance against common mode signals.

Figure 5:
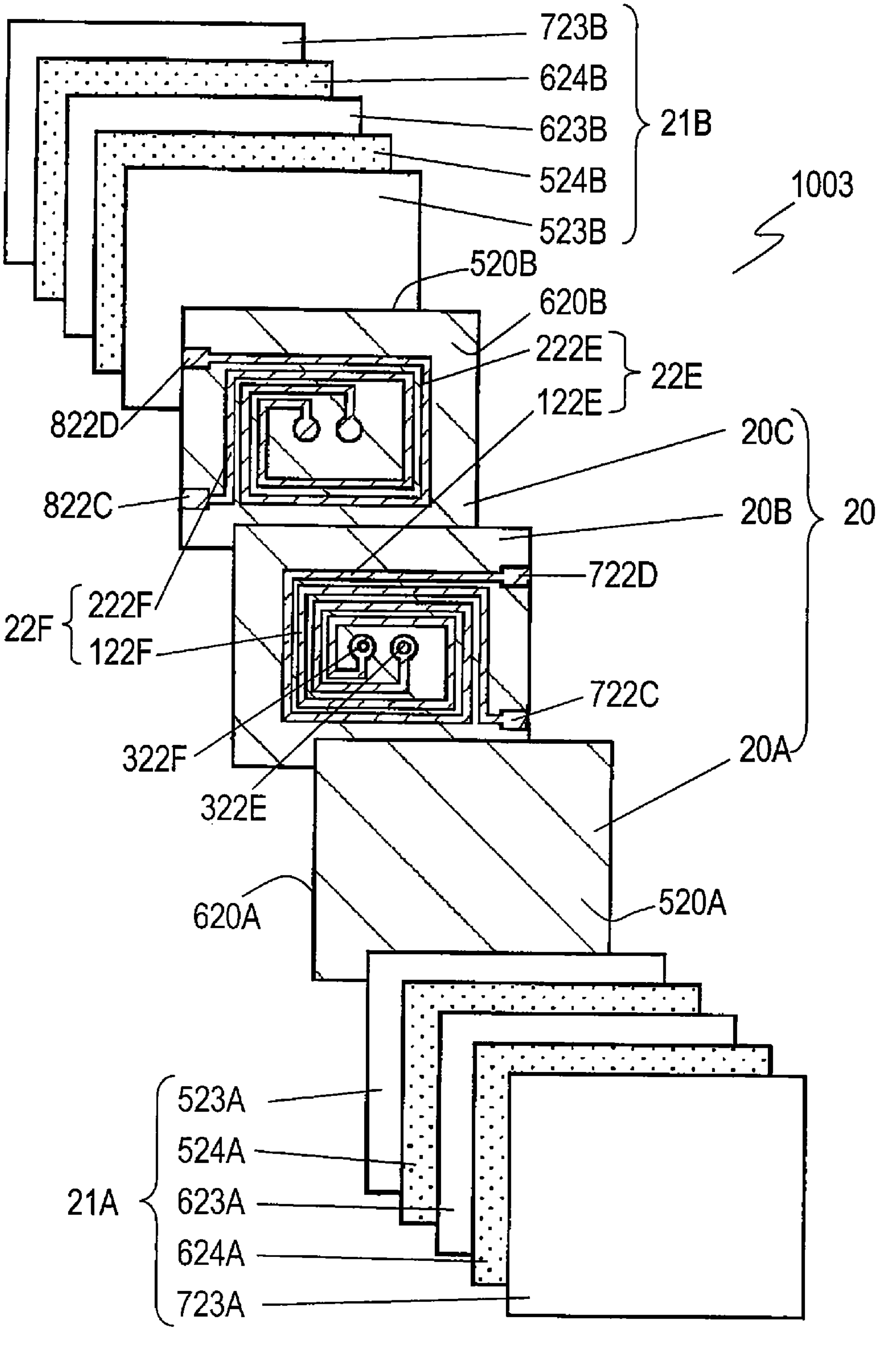
FIG. 5 is an exploded perspective view of still another common mode noise filter according to Embodiment 1.
Figure 6:
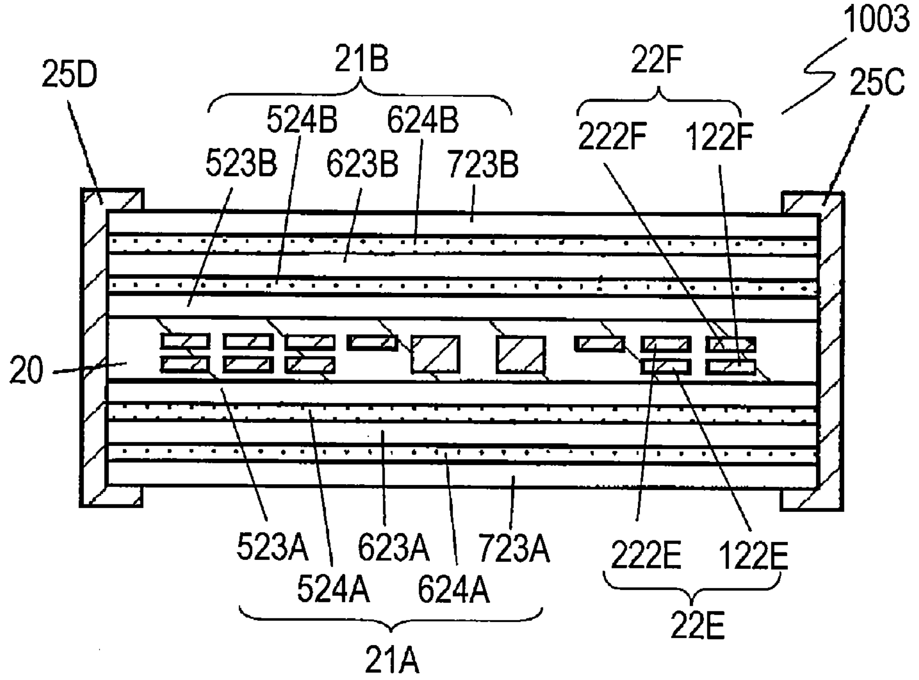
FIG. 6 is a sectional view of the common mode noise filter shown in FIG. 5.

FIG. 5 is an exploded perspective view of still another common mode noise filter 1003 according to Embodiment 1. FIG. 6 is a sectional view of filter 1003. In FIG. 5, components identical to those shown in FIGS. 1 to 3 are denoted by the same reference numerals, and their description is omitted. Filter 1003 includes plane coils 22E and 22F embedded in nonmagnetic layer 20 instead of plane coils 22A and 22B of common mode noise filter 1001 shown in FIG. 1. Plane coils 22E and 22F form a double-spiral shape. Plane coil 22E includes spiral plane coil 122E provided on surface 620A of nonmagnetic segment layer 20A, spiral plane coil 222E provided on surface 620B of nonmagnetic segment layer 20C, and via-conductor 322E which is provided in nonmagnetic segment layer 20B and which connects plane coil 122E electrically with plane coil 222E. Plane coil 22F includes spiral plane coil 122F provided on surface 620A of nonmagnetic segment layer 20A, spiral plane coil 222F provided on surface 620B of nonmagnetic segment layer 20C, and via-conductor 322F which is provided in nonmagnetic segment layer 20B and connects plane coil 122F electrically with plane coil 222F. Plane coils 122E and 122F form a double-spiral shape, and plane coils 222E and 222F form a double-spiral shape. Extraction electrodes 722D and 822D are connected with both ends of plane coil 22E, respectively. Extraction electrodes 722C and 822C are connected with ends of plane coil 22F, respectively. Extraction electrodes 722D and 822D are connected to external electrodes 25A and 25B, respectively. Extraction electrodes 722C and 822C are connected to external electrodes 25C and 25D, respectively.

Common mode noise filters 1001 and 1002 shown in FIGS. 3, 4 require at least four layers in order to form plane coils 22A and 22B. In filter 1003 shown in FIG. 5, plane coils 22E and 22F forming the double-spiral shapes can be formed on two layers, thus allowing common mode noise filter 1003 to be manufacture with high productivity.

Figure 7:
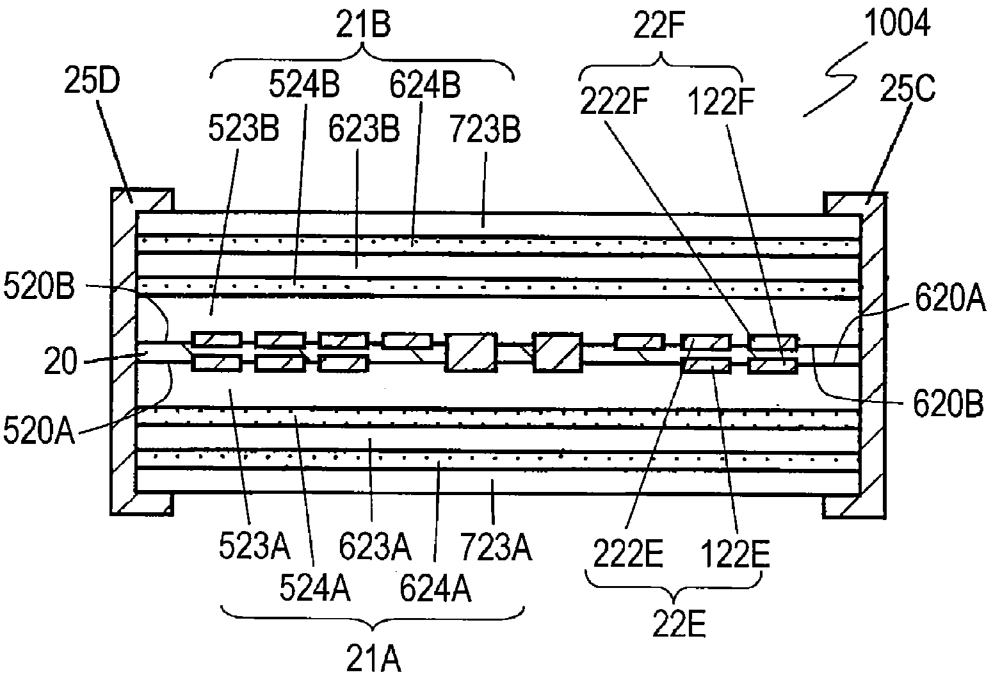
FIG. 7 is a sectional view of a further common mode noise filter according to Embodiment 1.

FIG. 7 is a sectional view of further common mode noise filter 1004 according to Embodiment 1. In FIG. 7, components identical to those shown in FIGS. 5 and 6 are denoted by the same reference numerals, and their description is omitted. In filter 1004, plane coils 22E and 22F are provided at the boundary between nonmagnetic layer 20 and magnetic layer 21A and at the boundary between nonmagnetic layer 20 and magnetic layer 21B. In other words, plane coils 122E and

122F are provided between surface 520A of nonmagnetic layer 20 and surface 2523A of magnetic layer 21A (magnetic oxide layer 523A). Plane coil 222E and 222F are provided at the boundary between nonmagnetic layer 20 and magnetic layer 21B, namely between surface 520B of nonmagnetic layer 20 and surface 1523B of magnetic layer 21B (magnetic oxide layer 523B). Plane coils 22E and 22F approximate more closely to magnetic layers 21A, 21B, respectively, than those of common mode noise filter 1003 shown in FIG. 4, accordingly allowing filter 1004 to have higher impedance against common mode signals.

Exemplary Embodiment 2

A common mode noise filter according to Exemplary Embodiment 2 has the same structure as common mode noise filter 1001 shown in FIGS. 1 and 2. Nonmagnetic layer 20 of the common mode noise filter according to Embodiment 2 contains glass component.

Ceramic green sheet with thicknesses of about 50 μm to be nonmagnetic segment layers 20A to 20C of nonmagnetic layer 20 were produced from non-borosilicate glass ($SiO_2$—CaO—ZnO—MgO based glass) powder containing crystal as filler that can be fired at a temperature not higher than 920° C. and has a linear expansion coefficient of about $100\times10^{-7}$/° C. Fifty samples according to Embodiment 2 each including nonmagnetic layer 20 were produced by stacking nonmagnetic segment layers 20A to 20C. FIG. 11 shows the bonding strength of external electrodes 25A to 25D of these samples which were measured by the same method as filter 1001 according to Embodiment 1.

As shown in FIG. 11, nonmagnetic layer 20 containing the glass material provides a large bonding strength between nonmagnetic layer 20 and external electrodes 25A to 25D and decreases variation of the strength. Thus, a common mode noise filter with higher mounting reliability is provided.

The glass material added into nonmagnetic layer 20 decreases the dielectric constant of nonmagnetic layer 20, accordingly allowing the common mode noise filter according to Embodiment 2 to be used in a high-frequency band.

The glass powder to form nonmagnetic layer 20 of the filter according to Embodiment 2 may be other glass ceramic powder, such as dielectric-material-based glass-crystal, glass-alumina, or glass-forsterite, that can be fired at a temperature not higher than 920° C. and has a linear expansion coefficient ranging from about $80\times10^{-7}$/° C. to $110\times10^{-7}$/° C. This decreases the dielectric constant of nonmagnetic layer 20, accordingly providing a common mode noise filter that has superior electrical characteristics in up to a high-frequency band.

Exemplary Embodiment 3

Figure 8:
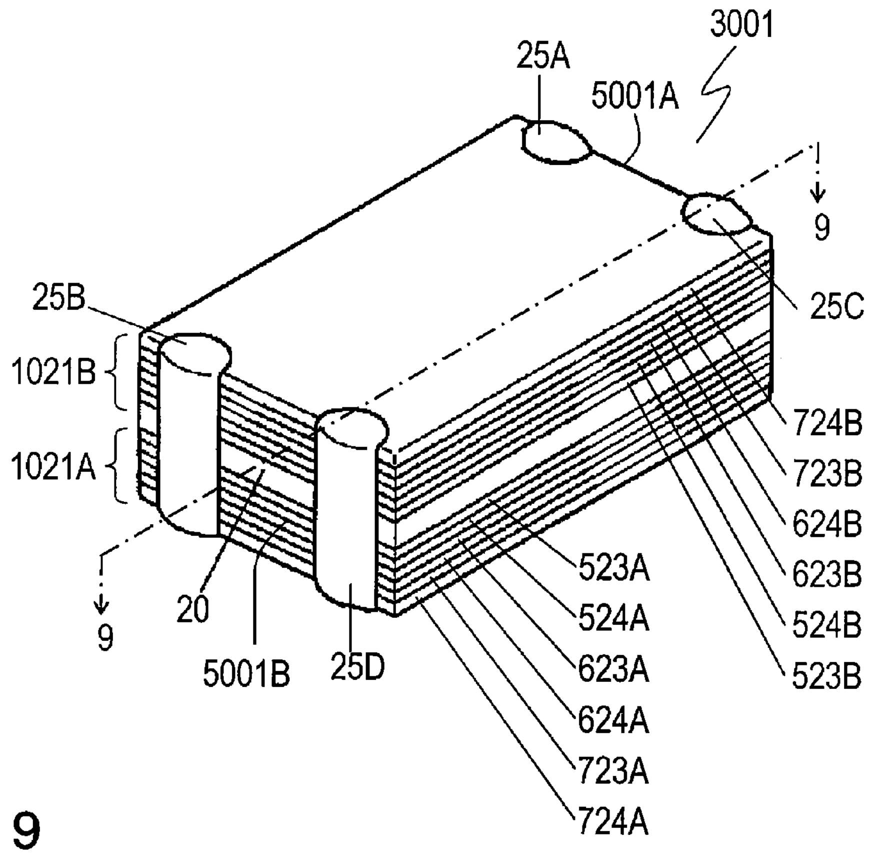
FIG. 8 is a perspective view of a common mode noise filter according to Exemplary Embodiment 3 of the invention.
Figure 9:
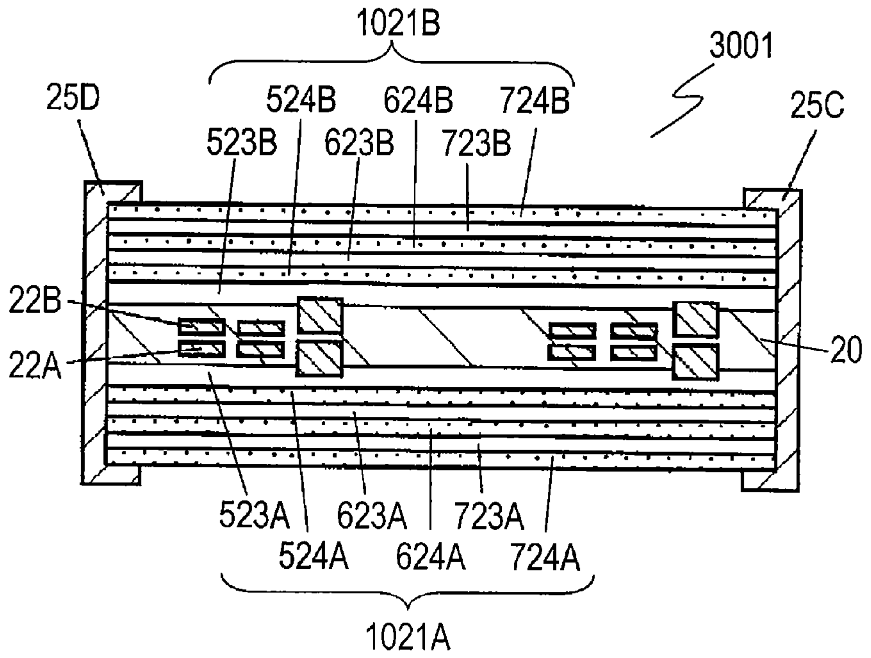
FIG. 9 is a sectional view of the common mode noise filter at line 9-9 shown in FIG. 8.

FIG. 8 is a perspective view of common mode noise filter 3001 according to Exemplary Embodiment 3 of the present invention. FIG. 9 is a sectional view of filter 3001 at line 9-9 shown in FIG. 8. Component identical to those of the common mode noise filter according to Embodiments 1 and 2 shown in FIG. 1 are denoted by the same reference numerals, and their description is omitted.

Common mode noise filter 3001 includes magnetic layers 1021A and 1021B instead of magnetic layers 21A and 21B of common mode noise filter 1001 according to Embodiment 1. Magnetic layer 1021A further includes insulator layer 724A containing glass component provided on magnetic oxide layer 723A of magnetic layer 21A of filter 1001. Magnetic layer 1021B further includes insulator layer 724B containing glass component provided on magnetic oxide layer 723B of magnetic layer 21B of filter 1001. That is, the respective outermost layers of magnetic layers 1021A and 1021B are insulator layers 724A are 724B containing the glass component, while insulator layers 724A and 724B expose outside magnetic layers 1021A and 1021B, respectively.

Ceramic green sheets with thicknesses of about 25 μm to be insulator layers 724A and 724B were produced from powder mixture of non-borosilicate glass ($SiO_2$—CaO—ZnO—MgO-based glass) that can be fired at a temperature not higher than 920° C. and 9 wt % of Ni—Zn—Cu ferrite. Insulator layers 724A and 724B including the glass component are formed by stacking these ceramic green sheets on green sheets to be magnetic oxide layers 723A and 723B, respectively. Fifty samples according to Embodiment 3 each including magnetic layers 1021A and 1021B and nonmagnetic layer 20 made of non-borosilicate glass containing crystal as inorganic filler were produced. FIG. 11 shows the bonding strength of external electrodes 25A to 25D of these samples which were measured by the same method as filter 1001 according to Embodiment 1.

As shown in FIG. 11, insulator layer 724A and 724B containing the glass component as the outermost layers increases the bonding strength of external electrodes 25A to 25D and decreases variation of the strength. Thus, common mode noise filter 3001 with high mounting reliability is provided.

Insulator layers 724A and 724B may be made of other glass ceramic, such as dielectric-material-based glass-crystal, glass-alumina, or glass-forsterite, that can be fired at a temperature not higher than 920° C. and has a linear expansion coefficient ranging from about $80\times10^{-7}$/° C. to $110\times10^{-7}$/° C.

A sample including nonmagnetic layer 20 containing Zn—Cu ferrite provided the same effects.

Exemplary Embodiment 4

A common mode noise filter according to Exemplary Embodiment 4 has the same structure as that of common mode noise filter 1001 shown in FIGS. 1 to 3.

In a common mode noise filter according to Embodiment 4, Ag paste to be applied on edge surfaces 1001A and 1001B to form base electrode layers 125C and 125D of external electrodes contains the same glass powder as that of at least one of glass component contained in nonmagnetic layer 20 and glass component contained in magnetic layers 21A and 21B (insulator layers 524A, 524B, 624A, and 624B). In other words, the glass component contained in nonmagnetic layer 20 may be the same as that in magnetic layers 21A and 21B (insulator layers 524A, 524B, 624A, and 624B). Ni-plated layers 225C and 225D are formed on base electrode layers 125C and 125D, respectively. Sn-plated layers 325C and 325D are formed on Ni-plated layers 225C and 225D, respectively.

Nonmagnetic layer 20 is made of glass ceramic. The Ag paste is produced by mixing and kneading 5 wt % of non-borosilicate glass and binder, such as ethyl cellulose, α-terpineol, or carbitol acetate, with Ag powder. Fifty samples of the common mode noise filters according to Embodiment 4 were produced by applying the Ag paste onto edge surfaces 1001A and 1001B to form base electrode layers 125C and 125D. FIG. 11 shows the bonding strength of external electrodes 25A to 25D of these samples which were measured by the same method as filter 1001 according to Embodiment 1.

As shown in FIG. 11, the common mode noise filter according to Embodiment 4 causes continuity between the glass component of nonmagnetic layer 20 and magnetic layers 21A and 21B, and the glass component of base electrode layers 125C and 125D of external electrodes 25C and 25D.

This continuity further increases the bonding strength between edge surfaces 1001A and 1001B and the external electrodes, accordingly providing the common mode noise filter with high mounting reliability.

Ag paste containing less than 1 wt % of glass powder mixed therein for base electrode layers 125C and 125D provides small effects in increasing the bonding strength. Ag paste containing more than 5 wt % of the glass component decreases the bonding strength between base electrode layer 125C and Ni-plated layer 225C and the bonding strength between base electrode layer 125D and Ni-plated layer 225D. Thus, the amount of glass powder to be mixed into the Ag paste for base electrode layers 125C and 125D ranges preferably from 1 wt % to 5 wt %. Even if Pt or Pd is contained in the Ag paste, glass powder mixed into the Ag paste provided the same effects. The amount of the binder is determined mainly by a specific surface area of the powder, and was adjusted so that the Ag paste did not make thin spots or drips when being applied onto edge surfaces 1001A and 1001B.

Common mode noise filter 3001 which includes nonmagnetic layer 20 using Zn—Cu ferrite according to Embodiment 3 shown in FIG. 9 provided the same effects by forming the base electrode layer with the Ag paste according to Embodiment 4.

Exemplary Embodiment 5

Figure 10A:
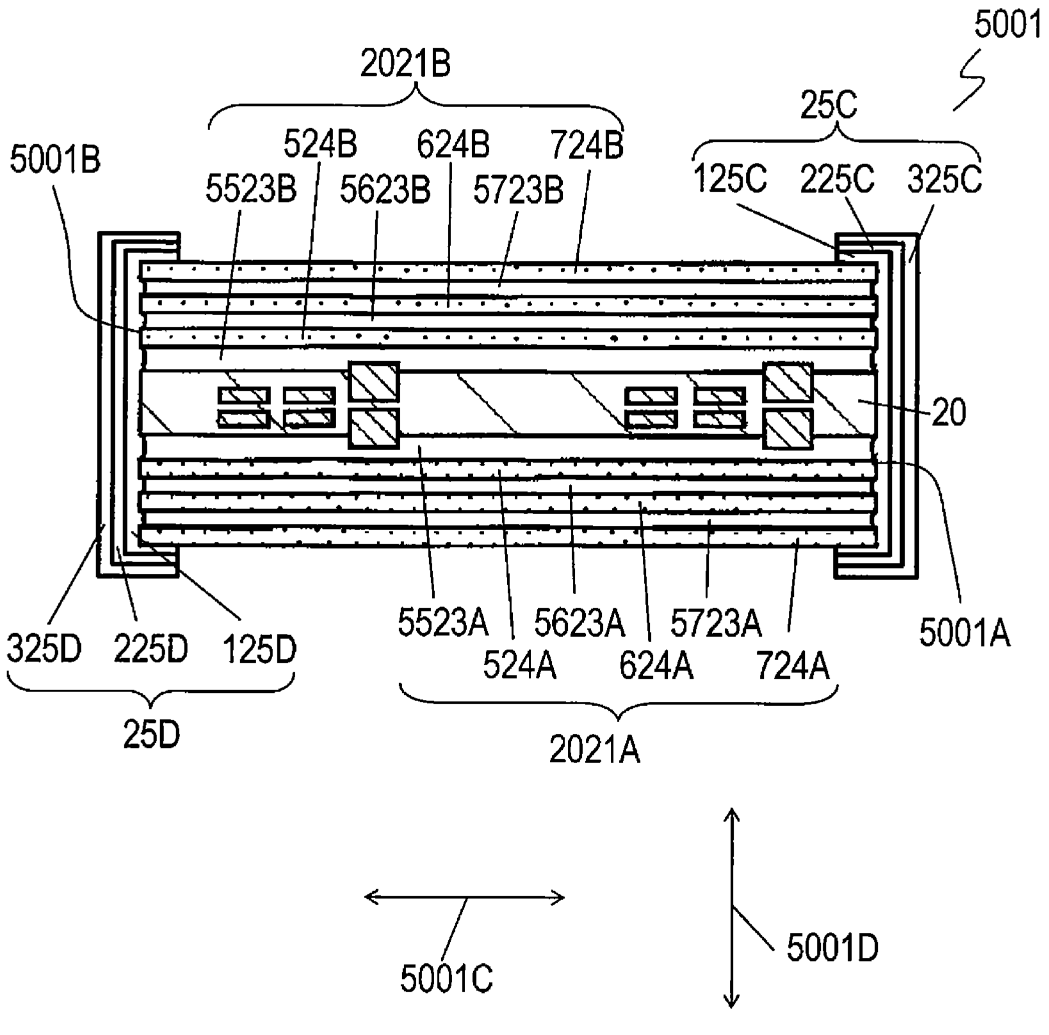
FIG. 10A is a sectional view of a common mode noise filter according to Exemplary Embodiment 5 of the invention.
Figure 10B:
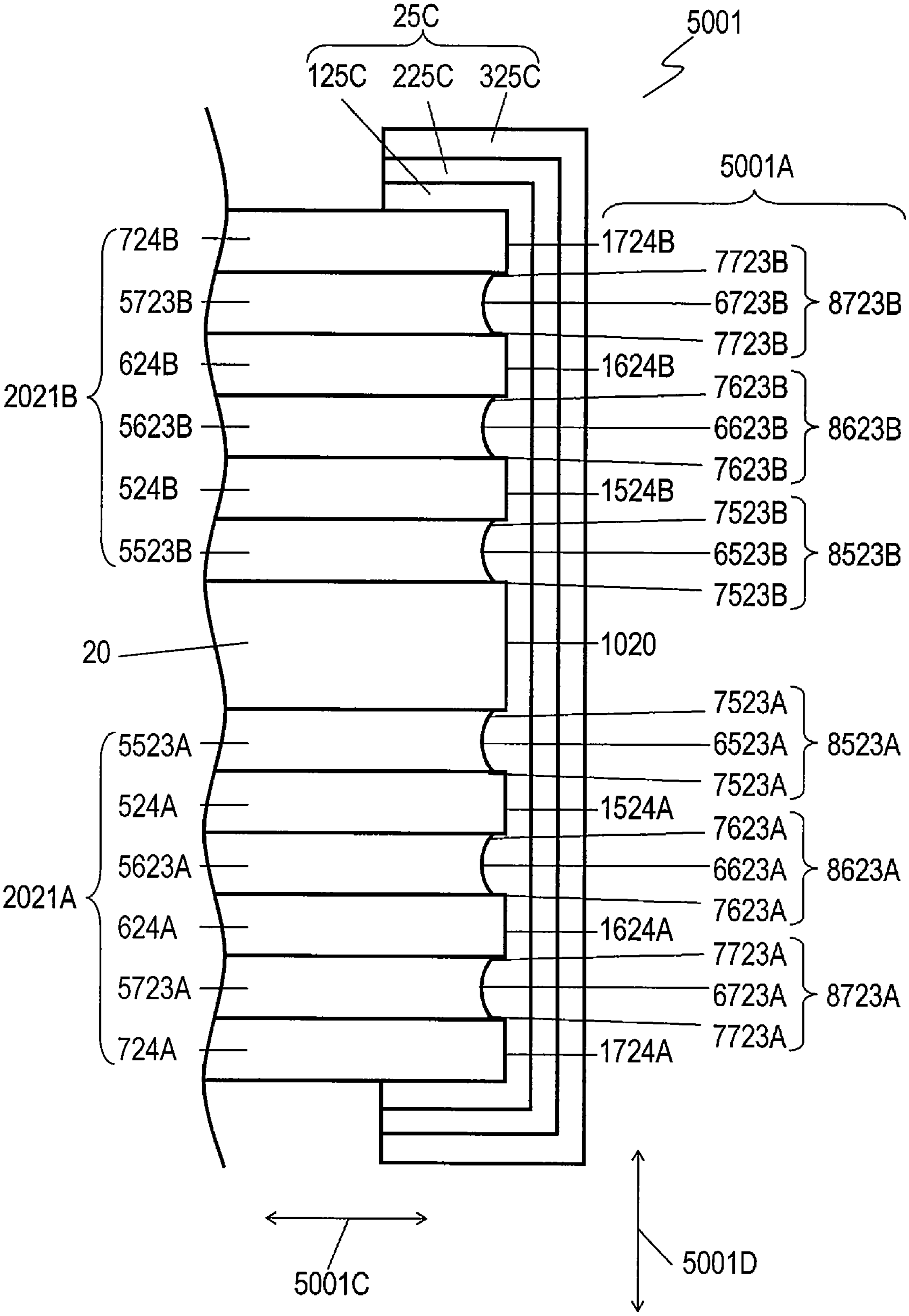
FIG. 10B is an enlarged sectional view of the common mode noise filter according to Embodiment 5.

FIG. 10A is a sectional view of common mode noise filter 5001 according to Exemplary Embodiment 5. FIG. 10B is an enlarged sectional view of common mode noise filter 5001. In FIG. 10A, Components identical to those of common mode noise filter 3001 according to Embodiment 3 shown in FIG. 9 are denoted by the same reference numerals, and their description is omitted.

Common mode noise filter 5001 includes magnetic layers 2021A and 2021B instead of magnetic layers 1021A and 1021B of common mode noise filter 3001 shown in FIG. 9. Magnetic layer 2021A includes magnetic oxide layers 5523A, 5523B, 5623A, 5623B, 5723A, and 5723B having widths smaller than those of nonmagnetic layer 20 and insulator layers 524A, 524B, 624A, 624B, 724A, and 724B instead of magnetic oxide layers 523A, 523B, 623A, 623B, 723A, and 723B shown in FIG. 9. In other words, edge surfaces 8523A, 8523B, 8623A, 8623B, 8723A, and 8723B of magnetic oxide layers 5523A, 5523B, 5623A, 5623B, 5723A, and 5723B sink below edge surfaces 1524A, 1524B, 1624A, 1624B, 1724A, and 1724B of insulator layers 524A, 524B, 624A, 624B, 724A, and 724B at edge surfaces 5001A and 5001B.

A method of manufacturing common mode noise filter 5001 will be described below.

Ceramic green sheet with thicknesses of 25 μm to be insulator layers 524A, 524B, 624A, 624B, 724A, and 724B are produced from non-borosilicate glass powder with a firing-contraction rate having its maximum value at about 750° C.

Ceramic green sheets with thicknesses of about 100 μm to be magnetic oxide layers 5523A, 5523B, 5623A, 5623B, 5723A, and 5723B are produced from Ni—Zn—Cu ferrite oxide magnetic powder with a firing contraction rate having its maximum value at about 850° C.

These ceramic green sheets are stacked to produce a green-sheet-laminated body similarly to that of Embodiment 1.

This green-sheet-laminated body are fired at about 900° C., which is lower than the melting point of material of plane coils 22A and 22B, thus providing a laminated fired body including plane coils 22A and 22B embedded therein. During this firing process, insulator layers 524A, 524B, 624A, 624B, 724A, and 724B contacting magnetic oxide layers 5523A, 5523B, 5623A, 5623B, 5723A, and 5723B which are hardly sintered at a temperature lower than 800° C. are prevented from contracting in direction 5001C in parallel with surfaces 520A and 520B, but contract and become dense in thickness direction 5001D orthogonal to direction 5001C. Then, the temperature is raised to higher than 800° C. to cause magnetic oxide layers 5523A, 5523B, 5623A, 5623B, 5723A, and 5723B to sinter. Peripheries 7523A, 7523B, 7623A, 7623B, 7723A, and 7723B of edge surfaces 8523A, 8523B, 8623A, 8623B, 8723A, and 8723B of magnetic oxide layers 5523A, 5523B, 5623A, 5623B, 5723A, and 5723B are restrained on insulator layer 524A, 524B, 624A, 624B, 724A, and 724B which have become dense, and do not contract in direction 5001C at their interfaces. Respective centers 6523A, 6523B, 6623A, 6623B, 6723A, and 6723B and their vicinities of edge surfaces 8523A, 8523B, 8623A, 8623B, 8723A, and 8723B of magnetic oxide layers 5523A, 5523B, 5623A, 5623B, 5723A, and 5723B are distanced from the interfaces in the thickness direction, and contract in direction 5001C. Thus, edge surfaces 8523A, 8523B, 8623A, 8623B, 8723A, and 8723B of magnetic oxide layers 5523A, 5523B, 5623A, 5623B, 5723A, and 5723B which are sandwiched with insulator layers 524A, 524B, 624A, 624B, 724A, and 724B containing glass component sink below edge surfaces 1524A, 1524B, 1624A, 1624B, 1724A, and 1724B of insulator layers 524A, 524B, 624A, 624B, 724A, and 724B. Edge surface 1020 of nonmagnetic layer 20 and edge surfaces 1524A, 1524B, 1624A, 1624B, 1724A, and 1724B of insulator layers 524A, 524B, 624A, 624B, 724A, and 724B project from edge surfaces 8523A, 8523B, 8623A, 8623B, 8723A, and 8723B of magnetic oxide layers 5523A, 5523B, 5623A, 5623B, 5723A, and 5723B.

Extraction electrode 522C, 522D, 622C, and 622D from plane coils 22A and 22B expose at edge surfaces 5001A and 5001B from which edge surface 1020 of nonmagnetic layer 20 and edge surfaces 1524A, 1524B, 1624A, 1624B, 1724A, and 1724B of insulator layers 524A, 524B, 624A, 624B, 724A, and 724B project. Ag paste is applied onto edge surfaces 5001A and 5001B so as to be connected electrically with extraction electrodes 522C, 522D, 622C, and 622D, thereby forming base electrode layers 125C and 125D to form external electrodes 25A to 25D. Fifty samples of common mode noise filter 5001 according to Embodiment 5 were produced. FIG. 11 shows the bonding strength of external electrodes 25A to 25D of these samples which were measured by the same method as filter 1001 according to Embodiment 1.

As shown in FIG. 11, the bonding strength between insulator layers 524A, 524B, 624A, 624B, 724A, and 724B and external electrodes 25A to 25D of the samples of embodiment 5. The samples of common mode noise filter 5001 has a larger average bonding strength and smaller variation of the strength than samples of example 3 of Embodiment 3, and thus common mode noise filter 5001 has high mounting reliability.

A sample including nonmagnetic layer 20 containing Zn—Cu ferrite has the same effects. The Ag paste forming base electrode layers 125C and 125D may contain glass component of nonmagnetic layer 20 or glass component of insulator layers 524A, 524B, 624A, 624B, 724A, and 724B. Samples using such Ag paste have the same effects.

INDUSTRIAL APPLICABILITY

A common mode noise filter according to the present invention has a large bonding strength between an external electrode and an insulator layer and is useful as a small common mode noise filter required to have mounting reliability so that the filter may be used in an electronic device, particularly a portable electronic device.

The invention claimed is:

1. A common mode noise filter comprising:

a nonmagnetic layer having a first surface and a second surface opposite to the first surface;

a first magnetic layer including a first magnetic oxide layer having a first surface and a second surface opposite to the first surface of the first magnetic oxide layer, the first surface of the first magnetic oxide layer being provided on the first surface of the nonmagnetic layer, and a first insulator layer having a first surface and a second surface opposite to the first surface of the first insulator layer, the first surface of the first insulator layer being provided on the second surface of the first magnetic oxide layer, the first insulator layer containing glass component;

a second magnetic layer including a second magnetic oxide layer having a first surface and a second surface opposite to the first surface of the second magnetic oxide layer, the first surface of the second magnetic oxide layer being provided on the second surface of the nonmagnetic layer, and a second insulator layer having a first surface and a second surface opposite to the first surface of the second insulator layer, the first surface of the second insulator layer being provided on the second surface of the second magnetic oxide layer, the second insulator layer containing glass component;

a third magnetic layer including a third magnetic oxide layer having a first surface and a second surface opposite to the first surface of the third magnetic oxide layer, the first surface of the third magnetic oxide layer being provided on the second surface of the first insulator layer, and a third insulator layer having a first surface and a second surface opposite to the first surface of the third insulator layer, the first surface of the third insulator layer being provided on the second surface of the third magnetic oxide layer, the third insulator layer containing glass component;

a fourth magnetic layer including a fourth magnetic oxide layer having a first surface and a second surface opposite to the first surface of the fourth magnetic oxide layer, the first surface of the fourth magnetic oxide layer being provided on the second surface of the second insulator layer, and a fourth insulator layer having a first surface and a second surface opposite to the first surface of the fourth insulator layer, the first surface of the fourth insulator layer being provided on the second surface of the fourth magnetic oxide layer, the fourth insulator layer containing glass component;

a fifth magnetic oxide layer provided on the second surface of the third insulator layer;

a sixth magnetic oxide layer provided on the second surface of the fourth insulator layer;

a first plane coil provided between the first magnetic layer and the second magnetic layer, the first plane coil contacting the nonmagnetic layer;

a second plane coil provided between the first magnetic layer and the second magnetic layer, the second plane coil contacting the nonmagnetic layer, the second plane coil facing the first plane coil;

a first external electrode connected electrically with the first plane coil; and a second external electrode connected electrically with the second plane coil, wherein the first external electrode contains glass component.

2. The common mode noise filter as claimed in claim 1, wherein the first plane coil and the second plane coil are embedded in the nonmagnetic layer.

3. The common mode noise filter as claimed in claim 1, wherein the first plane coil is provided on the first surface of the nonmagnetic layer, and the second plane coil is provided on the second surface of the nonmagnetic layer.

4. The common mode noise filter as claimed in claim 1, wherein the first plane coil and the second plane coil form a double-spiral shape.

5. The common mode noise filter as claimed in claim 1, wherein the first magnetic layer has an edge surface including an edge surface of the first magnetic oxide layer and an edge surface of the first insulator layer, the second magnetic layer has an edge surface including an edge surface of the second magnetic oxide layer and an edge surface of the second insulator layer, and the first external electrode is provided on the edge surface of the first magnetic layer and on the edge surface of the second magnetic layer.

6. The common mode noise filter as claimed in claim 5, wherein the edge surface of the first insulator layer projects from the edge surface of the first magnetic oxide layer.

7. The common mode noise filter as claimed in claim 5, wherein the edge surface of the second insulator layer projects from the edge surface the second magnetic oxide layer.

8. The common mode noise filter as claimed in claim 1, wherein the glass component of the first external electrode is identical to the glass component of the first insulator layer.

9. The common mode noise filter as claimed in claim 1, wherein the nonmagnetic layer contains glass component.

10. The common mode noise filter as claimed in claim 9, wherein the glass component of the first external electrode is identical to the glass component of the nonmagnetic layer.

11. The common mode noise filter as claimed in claim 9, wherein the glass component of the nonmagnetic layer is identical to the glass component of the first insulator layer.

12. The common mode noise filter as claimed in claim 1, wherein the first magnetic layer further includes a third insulator layer exposing outside the first magnetic layer, the third insulator layer containing glass component, and the second magnetic layer further includes a fourth insulator layer exposing outside the second magnetic layer, the fourth insulator layer containing glass component.

13. The common mode noise filter as claimed in claim 1, wherein the first plane coil does not contact any one of the first insulator layer and the second insulator layer.

14. The common mode noise filter as claimed in claim 13, wherein the second plane coil does not contact any one of the first insulator layer and the second insulator layer.

15. The common mode noise filter as claimed in claim 1, wherein the fifth magnetic oxide layer has a first surface and a second surface opposite to the first surface of the fifth magnetic oxide layer, the first surface of the fifth magnetic oxide layer being provided on the second surface of the third insulator layer, the sixth magnetic oxide layer has a first surface and a second surface opposite to the first surface of the sixth magnetic oxide layer, the first surface of the sixth magnetic oxide layer being provided on the second surface of the fourth insulator layer, no layer containing a magnetic layer is located at an outer side of the second surface of the fifth magnetic oxide layer, and no layer containing a magnetic layer is located at an outer side of the second surface of the sixth magnetic oxide layer.

16. The common mode noise filter as claimed in claim 15, wherein the fifth magnetic oxide layer is an outermost layer.

17. The common mode noise filter as claimed in claim 16, wherein the sixth magnetic oxide layer is an outermost layer.

18. A common mode noise filter comprising:

a nonmagnetic layer having a first surface and a second surface opposite to the first surface;

a first magnetic layer including a first magnetic oxide layer provided on the first surface of the nonmagnetic layer, and a first insulator layer provided on the first magnetic oxide layer, the first insulator layer containing glass component;

a second magnetic layer including a second magnetic oxide layer provided on the second surface of the nonmagnetic layer, and a second insulator layer provided on the second magnetic oxide layer, the second insulator layer containing glass component;

a first plane coil provided between the first magnetic layer and the second magnetic layer, the first plane coil contacting the nonmagnetic layer;

a second plane coil provided between the first magnetic layer and the second magnetic layer, the second plane coil contacting the nonmagnetic layer, the second plane coil facing the first plane coil;

a first external electrode connected electrically with the first plane coil; and a second external electrode connected electrically with the second plane coil, wherein the first magnetic layer has an edge surface including an edge surface of the first magnetic oxide layer and an edge surface of the first insulator layer, the second magnetic layer has an edge surface including an edge surface of the second magnetic oxide layer and an edge surface of the second insulator layer, the first external electrode is provided on the edge surface of the first magnetic layer and on the edge surface of the second magnetic layer, and the edge surface of the first insulator layer projects from the edge surface of the first magnetic oxide layer.

19. The common mode noise filter as claimed in claim 18, wherein the edge surface of the second insulator layer projects from the edge surface the second magnetic oxide layer.

20. A common mode noise filter comprising:

a nonmagnetic layer having a first surface and a second surface opposite to the first surface;

a first magnetic layer including a first magnetic oxide layer provided on the first surface of the nonmagnetic layer, and a first insulator layer provided on the first magnetic oxide layer, the first insulator layer containing glass component;

a second magnetic layer including a second magnetic oxide layer provided on the second surface of the nonmagnetic layer, and a second insulator layer provided on the second magnetic oxide layer, the second insulator layer containing glass component;

a first plane coil provided between the first magnetic layer and the second magnetic layer, the first plane coil contacting the nonmagnetic layer;

a second plane coil provided between the first magnetic layer and the second magnetic layer, the second plane coil contacting the nonmagnetic layer, the second plane coil facing the first plane coil;

a first external electrode connected electrically with the first plane coil; and a second external electrode connected electrically with a the second plane coil, wherein the first magnetic layer has an edge surface including an edge surface of the first magnetic oxide layer and an edge surface of the first insulator layer, the second magnetic layer has an edge surface including an edge surface of the second magnetic oxide layer and an edge surface of the second insulator layer, the first external electrode is provided on the edge surface of the first magnetic layer and on the edge surface of the second magnetic layer and the edge surface of the second insulator layer projects from the edge surface the second magnetic oxide layer.

* * * * *

UNITED STATES PATENT AND TRADEMARK OFFICE

CERTIFICATE OF CORRECTION

PATENT NO. : 7,911,295 B2
APPLICATION NO. : 11/571435
DATED : March 22, 2011
INVENTOR(S) : Tsutomu Inuzuka et al.

It is certified that error appears in the above-identified patent and that said Letters Patent is hereby corrected as shown below:

On the Cover Page, FIELD [86], PCT No.: "PCT/JP2006/009247" should read --PCT/JP2006/309247--

Signed and Sealed this
Ninth Day of August, 2011

David J. Kappos
*Director of the United States Patent and Trademark Office*